United States Patent
Brignone et al.

(10) Patent No.: US 8,575,467 B2
(45) Date of Patent: Nov. 5, 2013

(54) GENERATOR OF ELECTRIC ENERGY BASED ON THE THERMOELECTRIC EFFECT

(75) Inventors: Mauro Brignone, Orbassano (IT); Alessandro Ziggiotti, Orbassano (IT); Piermario Repetto, Orbassano (IT); Vito Guido Lambertini, Orbassano (IT); Piero Perlo, Orbassano (IT)

(73) Assignee: C.R.F. Società Consortile per Azioni, Orbassano (Turin) (IT)

( * ) Notice: Subject to any disclaimer, the term of this patent is extended or adjusted under 35 U.S.C. 154(b) by 1180 days.

(21) Appl. No.: 11/853,363

(22) Filed: Sep. 11, 2007

(65) Prior Publication Data

US 2008/0060695 A1    Mar. 13, 2008

(30) Foreign Application Priority Data

Sep. 12, 2006 (EP) .................................... 06425628

(51) Int. Cl.
- *H01L 35/30* (2006.01)
- *H01L 35/34* (2006.01)
- *H01L 35/00* (2006.01)

(52) U.S. Cl.
USPC ........................... 136/205; 136/201; 136/206

(58) Field of Classification Search
USPC ......................................... 136/205, 201, 206
See application file for complete search history.

(56) References Cited

U.S. PATENT DOCUMENTS

| 3,137,142 A | 6/1964 | Venema |
| 3,212,275 A | 10/1965 | Tillman |
| 3,356,539 A | 12/1967 | Stachurski |
| 3,607,444 A | 9/1971 | DeBucs |
| 4,065,936 A | 1/1978 | Fenton et al. |
| 4,320,246 A * | 3/1982 | Russell ........................ 136/248 |
| 4,650,919 A * | 3/1987 | Benson et al. ................ 136/212 |
| 5,860,472 A | 1/1999 | Batchelder |

(Continued)

FOREIGN PATENT DOCUMENTS

| EP | 1030379 A1 | 8/2000 |
| GB | 2172394 A | 9/1986 |

(Continued)

OTHER PUBLICATIONS

DiSalvo, Thermoelectric Cooling and Power Generation, Science, vol. 285, Jul. 1999, pp. 703-706.*
European search report for EP 06425628, dated Apr. 5, 2007.

*Primary Examiner* — Devina Pillay
(74) *Attorney, Agent, or Firm* — Heslin Rothenberg Farley & Mesiti P.C.; Victor A. Cardona, Esq.

(57) ABSTRACT

A generator of electric energy based on a thermoelectric effect includes a layer of thermoelectric material set between two pipes that guide two flows of fluid at temperatures different from one another. Each of the pipes has its wall in heat-conduction contact with respective side of the layer of thermoelectric material. Each pipe has a cavity of passage for the respective flow of fluid occupied by a porous material or divided by diaphragms into a plurality of sub-channels so as to obtain a large heat-exchange surface between each flow of fluid and the wall of the respective pipe and between said wall and the respective side of the layer of thermoelectric material.

13 Claims, 11 Drawing Sheets

(56) References Cited

U.S. PATENT DOCUMENTS

2002/0124574 A1 9/2002 Guttman et al.
2005/0083655 A1* 4/2005 Jairazbhoy et al. ............ 361/699
2005/0211436 A1* 9/2005 Fripp et al. .................... 166/302
2006/0157102 A1 7/2006 Nakajima et al.

FOREIGN PATENT DOCUMENTS

| WO | WO 94/12833 A1 | 6/1994 |
| WO | WO 02-18852 A1 | 3/2002 |
| WO | WO 2005/015106 A1 | 2/2005 |
| WO | WO 2005/020422 A1 | 3/2005 |

* cited by examiner

GENERATOR OF ELECTRIC ENERGY BASED ON THE THERMOELECTRIC EFFECT

CROSS REFERENCE TO RELATED APPLICATIONS

This application claims priority from European patent application No. 06425628.2, filed on Sep. 12, 2006, the entire disclosure of which is incorporated herein by reference.

BACKGROUND OF THE INVENTION

The present invention relates to generators of electric energy based on the thermoelectric effect. In particular, the invention regards a generator of electric energy of the type comprising:

a layer of thermoelectric material; and means for guiding a first flow of fluid at a higher temperature and a second flow of fluid at a lower temperature in a direction parallel and adjacent to the two opposite sides of the layer of thermoelectric material, in such a way as to produce a heat transfer through said layer of thermoelectric material, from the side adjacent to the flow of fluid at a higher temperature to the side adjacent to the flow of fluid at a lower temperature so as to generate a difference of electrical potential between two electrical terminals in electrical connection with the two opposite sides of the layer of thermoelectric material.

In the present description and in the attached claims, the expression "layer of thermoelectric material" is understood as referring both to the case of one or more pairs of elements made of thermoelectric material and to the case of a distribution of a number of thermoelectric cells, which include in themselves, in addition to the thermoelectric material, also the corresponding electrical-connection contacts, as will be illustrated in greater detail in what follows.

The problem of exploiting in an efficient way a difference in temperature between two flows of fluid in order to produce electric energy by means of the thermoelectric effect has already been tackled in the past, without being solved in a satisfactory way. The main difficulty consists in obtaining an acceptable efficiency of the process of energy generation. This can be explained with reference to the diagram illustrated in FIG. 1. In said figure, the reference number 1 designates a layer of thermoelectric material having two opposite sides H, C, lapped, respectively, by a flow of hot fluid F1 and by a flow of cold fluid F2, which have opposite directions with respect to one another. In order to obtain the maximum efficiency of operation of the layer of thermoelectric material 1, the ideal situation would be the one represented by the temperature diagram designated by $T_i$. According to said ideal situation, the temperature of each of the two fluids remains constant for points within the flow that are set at different distances from the layer of thermoelectric material 1 so that the entire temperature jump ΔT takes place within the layer of thermoelectric material 1, between its two opposite sides H and C. However, in actual fact, the real temperature diagram is the one designated by $T_r$. As may be seen, in actual fact, the temperature jump that occurs through the layer of thermoelectric material 1 is very small, the majority of the variation of temperature taking place in fact through the laminar layer L of each of the two flows of fluid.

FIG. 2 of the annexed plate of drawings shows, instead, how, in the case of a thermoelectric generator with solid-solid interface, the situation is close to the ideal one. With reference to FIG. 2, the reference number 1 designates once again the layer of thermoelectric material, whilst the reference numbers 2 and 3 designate two layers of material with high thermal conductivity, which are at two different temperatures. Also in FIG. 2, the diagram designated by $T_i$ indicates the ideal variation of temperature corresponding to the optimal exploitation of the layer of thermoelectric material. As has been said, in the above ideal situations, the entire temperature jump ΔT between the two layers 2, 3 occurs within the layer of thermoelectric material 1. The diagram designated by $T_r$ in FIG. 2 regards the real situation. As may be seen, the temperature jump that occurs through the thermoelectric layer is not exactly identical to the difference in temperature existing between the two layers 2, 3 but is almost equal thereto, the variation of temperature that occurs through each of the layers 2, 3 being in fact extremely small.

SUMMARY OF THE INVENTION

The purpose of the present invention is to provide a generator of electric energy of the type indicated at the start of the present description, i.e., of the type that exploits the difference in temperature between two flows of fluid that lap the two opposite sides of a layer of thermoelectric material, that will present a relatively high efficiency comparable to that of a thermoelectric generator with solid-solid interface.

A further purpose of the invention is to provide a generator of the type referred to above that is constituted by a relatively simple and low-cost structure.

A further purpose of the invention is to provide a generator that may be applied in a wide range of fields, both with parallel flows of fluid, and preferably in counter-current, and with flows of fluid that are orthogonal to one another.

Yet a further purpose of the invention is to provide a generator of the type specified above that can be configured for enabling high levels of efficiency with relatively small overall dimensions and that is in particular also applicable to the case where the two flows of fluid are constituted, respectively, by a flow of fuel mixture at inlet into a combustion chamber and by a flow of burnt gases at outlet from the aforesaid combustion chamber.

With a view to achieving said purposes, the subject of the invention is a generator of electric energy of the type referred to at the start of the present description, characterized in that the aforesaid means for guiding the aforesaid first fluid and the aforesaid second fluid are constituted by a first pipe and by a second pipe, the walls of which are in heat-conduction contact with the two opposite sides of the layer of thermoelectric material, the cavity of passage of each pipe being occupied by porous material or divided by diaphragms into a plurality of sub-channels so as to obtain a large surface of heat exchange between each flow of fluid, the wall of the respective pipe, and the respective side of the layer of thermoelectric material.

Thanks to the aforesaid characteristic, the generator according to the invention, albeit operating with flows of fluid, fits into a situation closer to what has been illustrated above with reference to FIG. 2 for the generators of the solid-solid interface type.

Each of the aforesaid pipes that guide each flow of fluid has its wall made of a material with high thermal conductivity.

In addition, in the preferred embodiment of the invention, both the layer of thermoelectric material and the two pipes that guide the two aforesaid flows of fluid have a longitudinally segmented structure so that each pipe made up of a succession of pipes is separated from one another by hollow spacer elements, made of thermally insulating material, whilst the layer of thermoelectric material is in turn constituted by a succession of thermoelectric sections separated from one another by a spacer element made of thermally insulating material or by an air gap, in such a way that the heat transfer occurs substantially only between facing sections of the two pipes and through the respective thermoelectric sections, whereas, instead, it does not substantially occur in the longitudinal direction of each pipe.

A further preferred and important characteristic of the present invention lies in the fact that the material constituting the thermoelectric sections can be different in different sections, the choice depending upon the range of operating temperatures, in such a way that the thermoelectric efficiency of the material is optimal according to the values of temperature to which it is subjected.

In one embodiment, the layer of thermoelectric material is made up of a distribution of thermoelectric cells, each comprising an array of thermoelectric elements connected electrically in series and thermally in parallel. Each thermoelectric cell will present its own two electrical contacts. The contacts of the various cells may be connected to one another in series or in parallel according to the requirements of the user.

According to a further embodiment, which is alternative to the previous one, the layer of thermoelectric material is made up of a series of elements made of thermoelectric material, and the electrical contacts that connect said elements to one another are constituted by the same pipes for guiding the first flow of fluid and the second flow of fluid, the wall of each pipe being in this case made of an electrically conductive material or coated with a layer of electrically conductive material.

In the case of the latter embodiment, there can be envisaged different configurations of the generator. In a first configuration, the sections of the two pipes are set staggered with respect to one another so as to define a serpentine electrical circuit passing in succession through the different sections of the layer of thermoelectric material, which are alternately constituted by elements of semiconductor material of type n and of type p. In a second configuration, the sections of the two pipes are set facing one another, and electrical-connection means are provided for mutual electrical connection in twos of the contiguous sections of one and the same pipe so as to define also in this case a serpentine electrical circuit passing in succession through the different sections of the layer of thermoelectric material.

In the case of the first embodiment described above, where the layer of thermoelectric material, or the sections of the layer of thermoelectric material, are constituted by a plurality of thermoelectric cells each incorporating the respective electrical contacts, there is obtained the simplification that the pipes for the two flows of fluid do not necessarily have to be made of electrically conductive material or be coated with electrically conductive material, in so far as they no longer form part of the electrical circuit. They maintain instead the primary function of allowing an efficient heat transfer between the flow of fluid guided by them and the respective side of the layer of thermoelectric material. Thanks to the simplification referred to above, the preferred embodiment that exploits thermoelectric cells is suited to being used both in the case of parallel flows of fluid and in the case of flows of fluid that are orthogonal to one another.

According to a further preferred characteristic, the entire structure of the generator is preferably insulated from the outside world with a layer of material with very low thermal conductivity, such as for example silica aerogel.

The structure of the generator can be developed so as to assume also configurations different from the elongated rectilinear configuration, such as for example a configuration bent over a number of times on itself.

BRIEF DESCRIPTION OF THE DRAWINGS

Further characteristics and advantages of the invention will emerge from the ensuing description with reference to the annexed plate of drawings, which are provided purely by way of non-limiting example and in which.

DETAILED DESCRIPTION OF THE INVENTION

Figure 1:
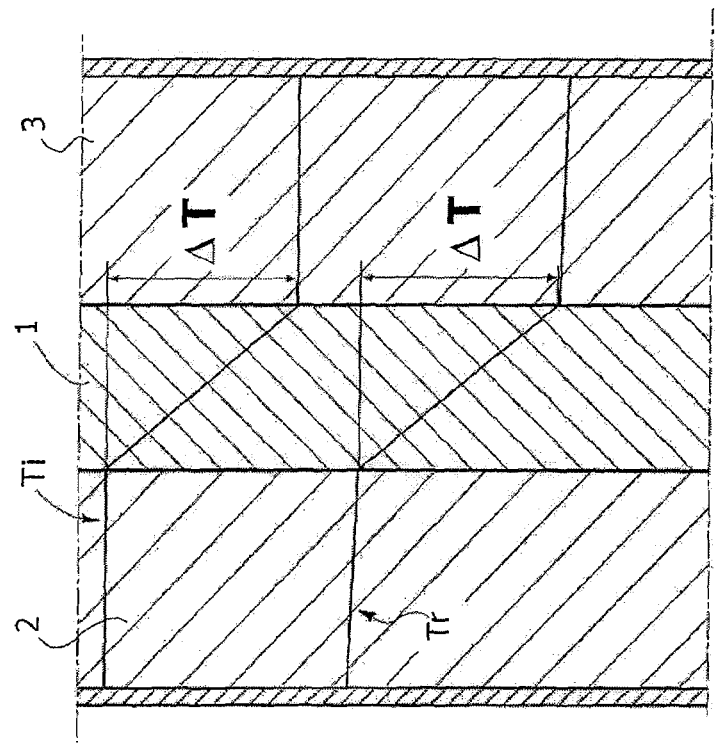
FIGS. 1 and 2 illustrate the conditions of operation in conventional thermoelectric generators, respectively of the type with gas-solid interface and solid-solid interface, according to what has already been described above.
Figure 2:
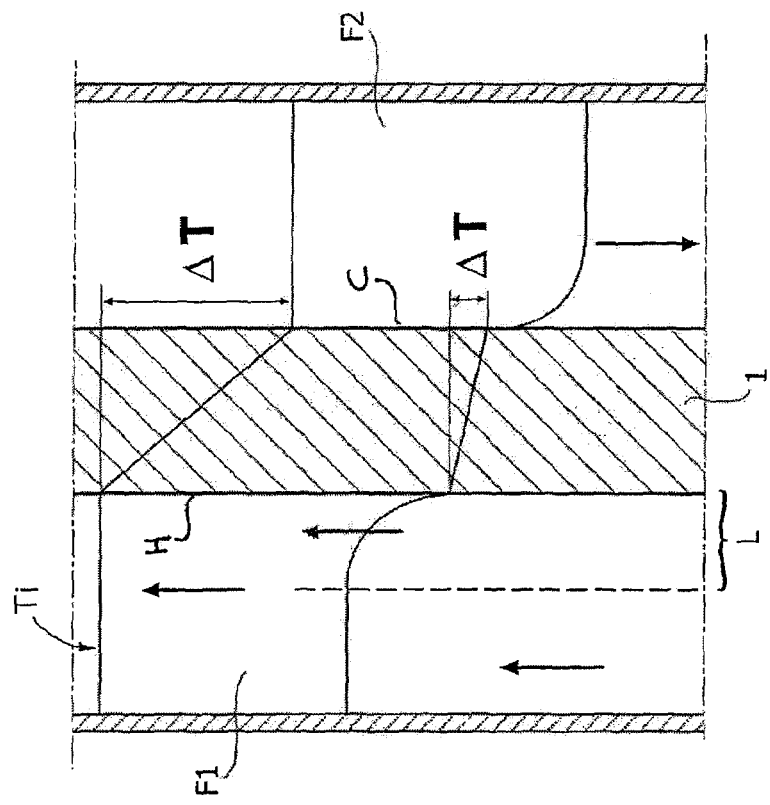
Figure 3:
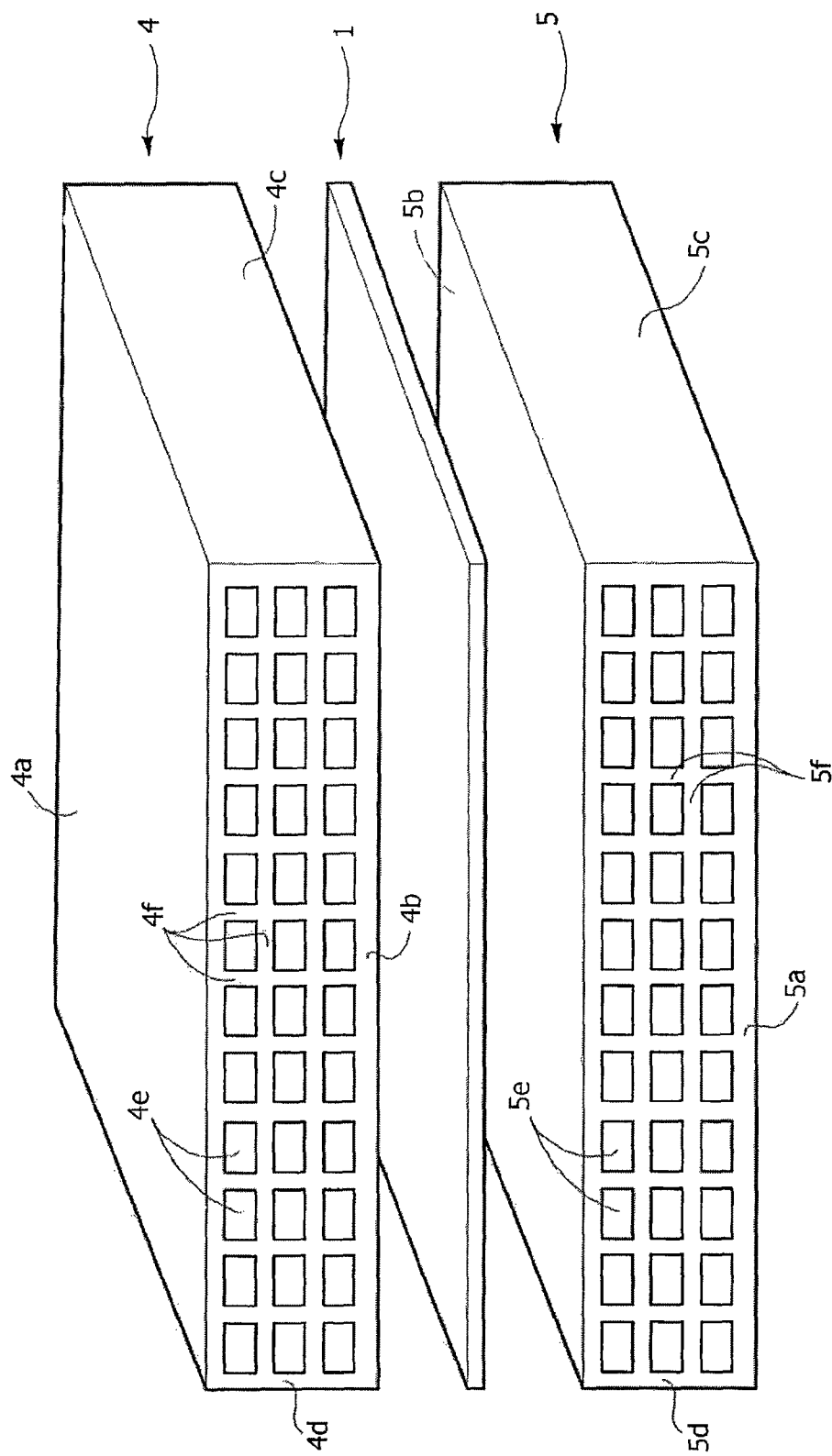
FIG. 3 is a schematic perspective view of a cross section of the thermoelectric generator according to a first embodiment of the invention.

With reference to FIG. 3, number 1 designates as a whole an element of thermoelectric material in the form of a plate, that can be made in any known way and set between two pipes (or sections of pipe, as will be described in detail in what follows), which are designated, respectively, by 4 and 5 and, in the example illustrated, are each constituted by an extruded element of metal material with high thermal conductivity. As may be seen in the drawing, each pipe 4 has an outer wall defining two main plane and opposite faces 4a, 4b and, respectively, 5a and 5b, and two opposite longitudinal faces 4c, 4d and, respectively, 5c and 5d. The walls define a cavity of passage that is divided into a plurality of sub-channels 4e and 5e by a plurality of diaphragms 4f and 5f orthogonal to one another. The arrangement described above tends to provide a sort of hybrid between the two conventional solutions with gas-solid interface and solid-solid interface, illustrated in FIGS. 1 and 2. In other words, the thermoelectric generator according to the invention exploits the difference of temperature existing between two flows of fluid, but pre-arranges the diaphragms 4f and 5f in order to provide a very large heat-exchange surface that tends to bring the real temperature diagram $T_r$ closer to the one illustrated in FIG. 2, instead of to the one illustrated in FIG. 1.

Figure 4:
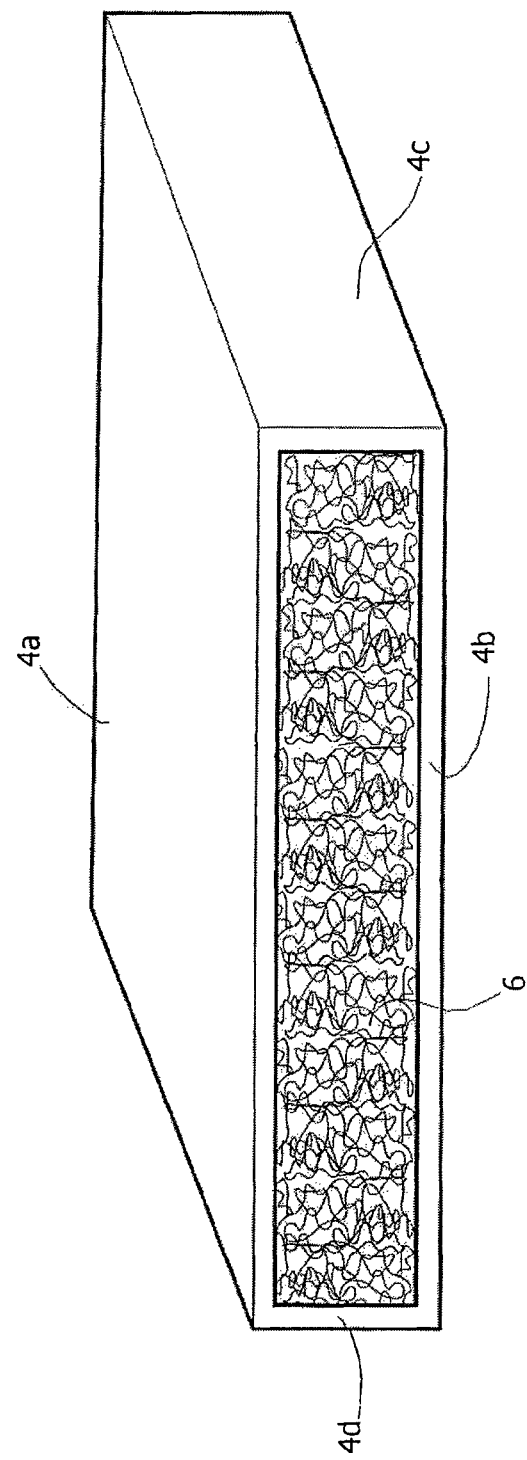
FIG. 4 illustrates a variant of FIG. 3.

FIG. 4 illustrates a variant of FIG. 3, where each pipe or section of pipe 4, 5, instead of presenting the form of an extruded sectional element with the cavities of passage divided into a plurality of sub-channels, has only the outer walls 4a, 4b, 4c, 4d (and likewise 5a, 5b, 5c, 5d), the cavity of passage of the fluid being occupied by a porous material, designated as a whole by the reference number 6, such as for example a sponge made of material with high thermal conductivity (copper, aluminium, silicon carbide, etc.) in thermal contact with the outer walls mentioned above.

Figure 5:
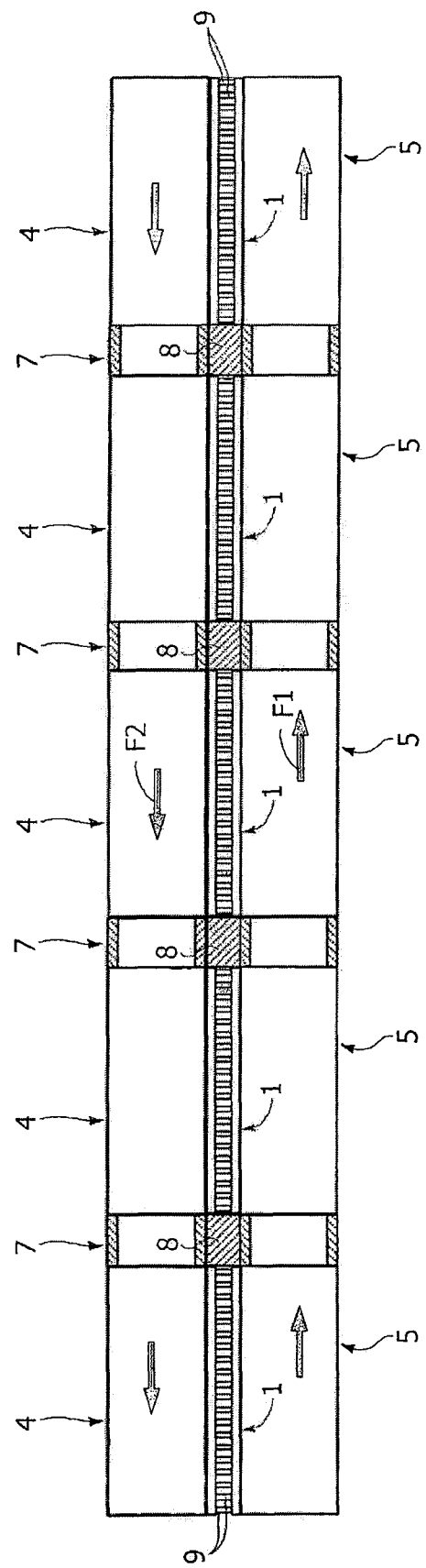
FIG. 5 is a schematic cross-sectional view of a first embodiment of the invention.
Figure 5A:
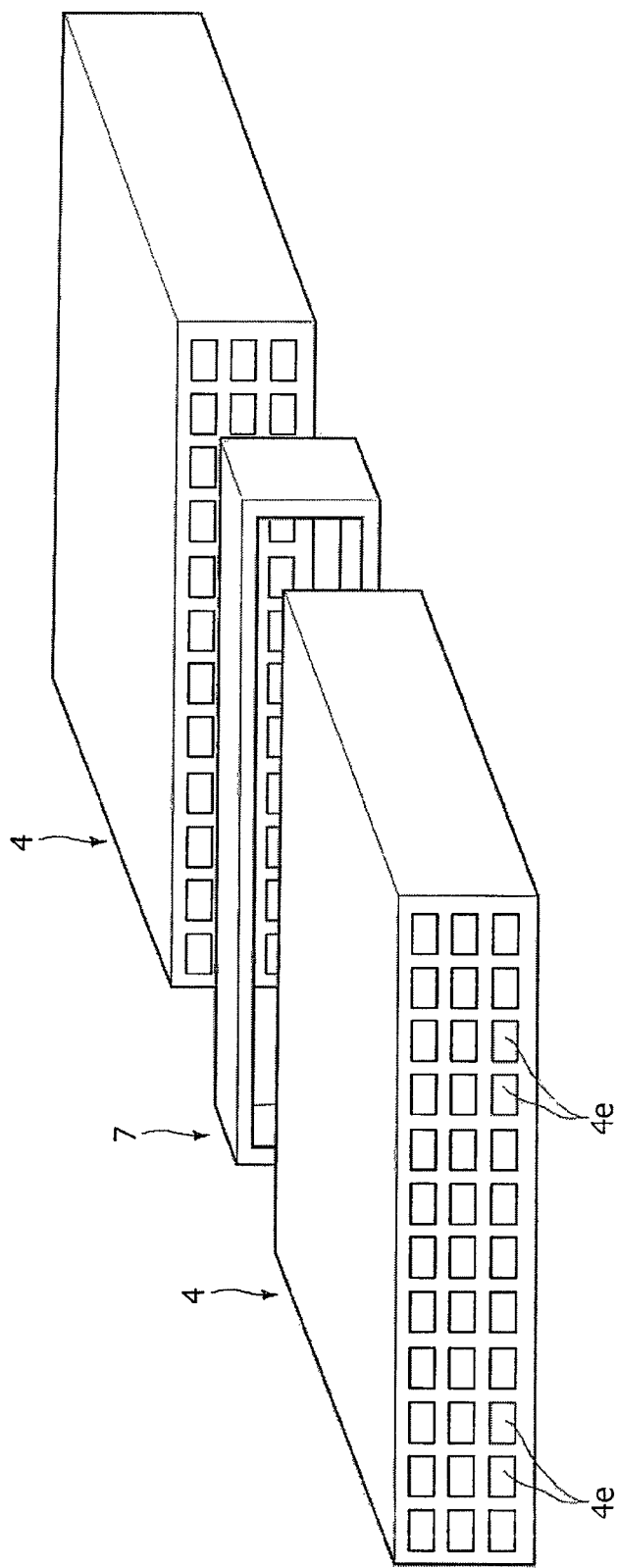
FIG. 5A is a schematic illustration in perspective view and at an enlarged scale of a detail of FIG. 5.

FIG. 5 illustrates a preferred embodiment, in which a thermoelectric generator is obtained, exploiting the scheme of FIG. 3, but dividing longitudinally both the pipe 4 for the first flow of fluid F1 and the second pipe for the second flow of fluid F2, as well as the layer of thermoelectric material 1, into a number of sections, each of which is respectively designated by 4, 5 and 1. The succession of sections 4 of the pipe for guiding the flow F1 and the succession of sections 5 of the pipe for guiding the flow F2 comprise, between each section and the other, a hollow spacer element 7 made of thermally insulating material (see FIG. 5A).

Furthermore, in the case of the embodiment illustrated in FIG. 5, each section 1 of the layer of thermoelectric material is separated from the contiguous one by a spacer element 8 made of thermally insulating material. Alternatively, it is also possible to provide simply an air gap, instead of the spacer 8.

Once again in the specific case of the embodiment illustrated in FIG. 5, each thermoelectric section 1 is made up of a plane distribution consisting of an array of a plurality of thermoelectric elements 9 connected electrically in series and thermally in parallel. The contacts of the thermoelectric cells can be connected to one another in series or in parallel.

The arrangement described above, with the division of the pipes into separate sections 4, 5 and spacer elements 7 made of thermally insulating material tends to guarantee that the heat transfer will occur only vertically (as viewed in the drawings) between facing sections 4, 5 through the corresponding thermoelectric sections 1, and there is instead substantially no heat transfer longitudinally along either of the two pipes for guiding the flows F1, F2.

Figure 6:
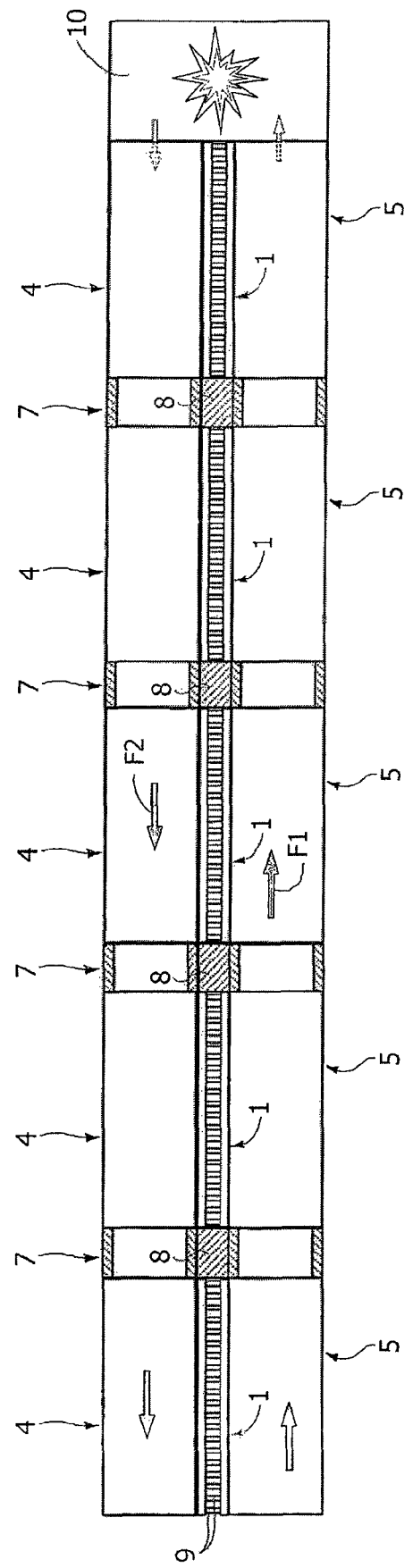
FIG. 6 illustrates a variant that differs from that of FIG. 5 as regards the pre-arrangement of a combustion chamber.

FIG. 6 differs from FIG. 5 in that, in this case, the electric generator is associated to a combustion chamber 10 of any known type in such a way that the cold flow is constituted by the flow of fuel mixture at inlet to the combustion chamber 10, whilst the hot flow is constituted by the burnt gases at outlet from the combustion chamber 10. Of course, the combustion chamber is provided with means of any known type for triggering combustion in the combustion chamber 10. The combustion chamber 10 can also be obtained, according to known technologies, in the form of a combustion microchamber, for being integrated in a thermoelectric generator of reduced dimensions.

Figure 7:
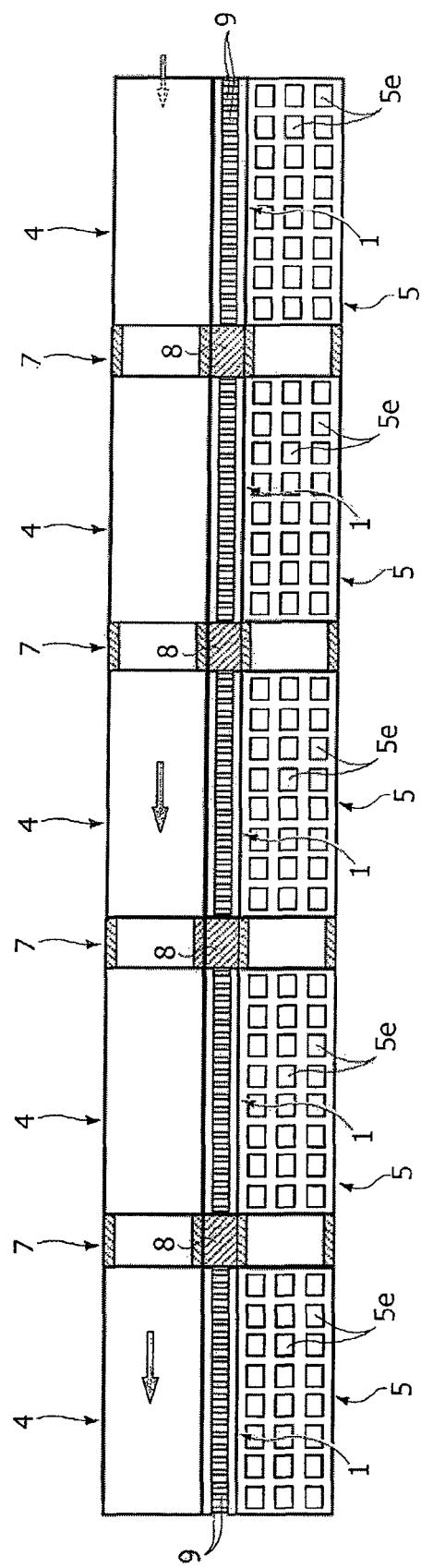
FIG. 7 illustrates a further variant of FIG. 5, which differs in that it envisages two flows of fluid that, instead of having parallel and opposite directions, have directions orthogonal to one another.

FIG. 7 is substantially similar to FIG. 5 and differs from this only in that the sections of pipe 4, 5 are arranged so as to guide respective flows of fluid F1 and F2 in directions orthogonal to one another.

FIGS. 8 to 11 illustrate further alternative configurations of an embodiment of the invention that envisages the use, as thermoelectric sections 1, of thermoelectric elements constituted alternately by elements of semiconductor material of type n and type p. In the case of said embodiment, the electrical contacts connected to the two opposite sides of each thermoelectric section 1 are constituted by the same sections of pipe 4, 5. In this case, the sections of pipe 4, 5 must necessarily be constituted by walls of electrically conductive material or in any case be coated with a layer of electrically conductive material.

Figure 8:
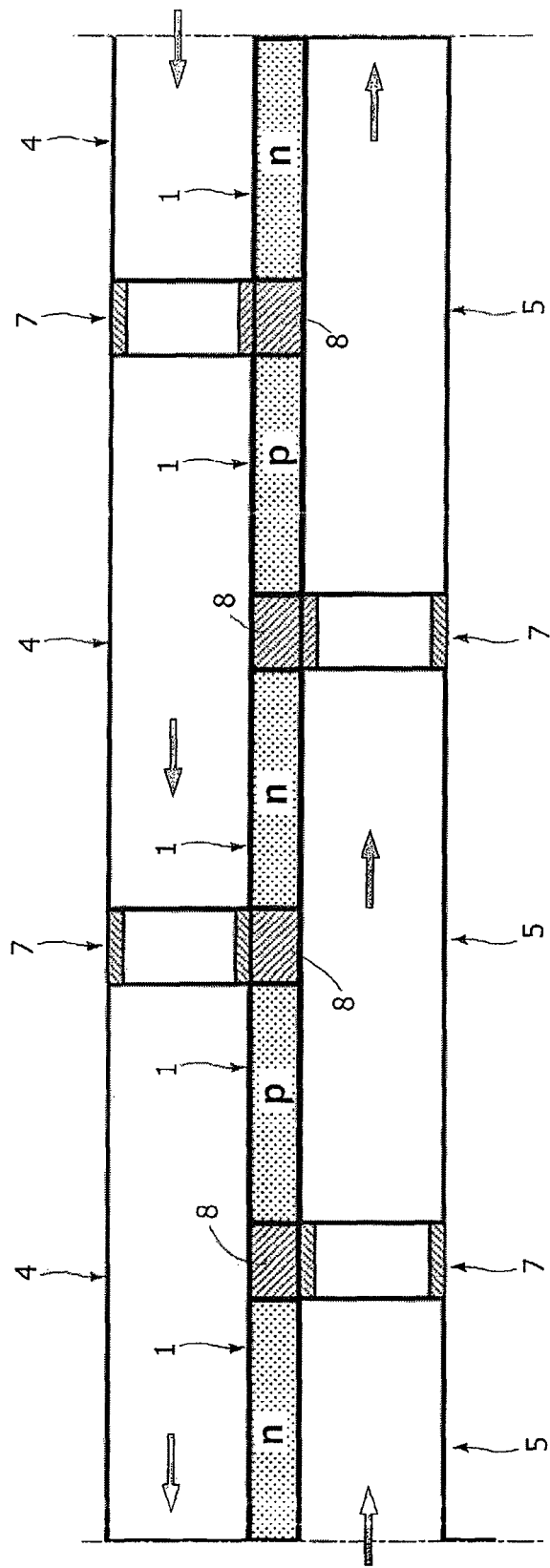
FIGS. 8, 9, 10 and 11 illustrate further alternative configurations of the generator according to the invention.

In the case of FIG. 8, the sections of pipe 4, 5 are staggered with respect to one another in such a way that a single serpentine electrical circuit is obtained, which traverses the various thermoelectric sections 1 in succession.

Figure 9:
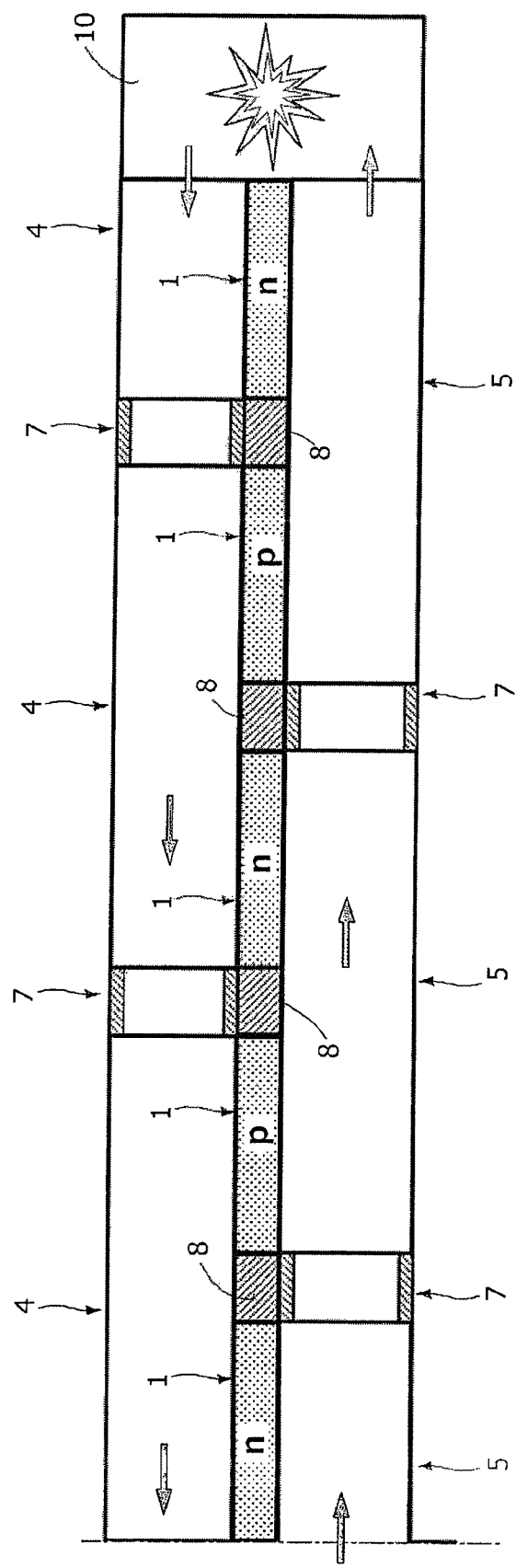

FIG. 9 differs from FIG. 8 in that associated thereto is a combustion chamber 10, according to what has already been described above with reference to FIG. 6.

Figure 10:
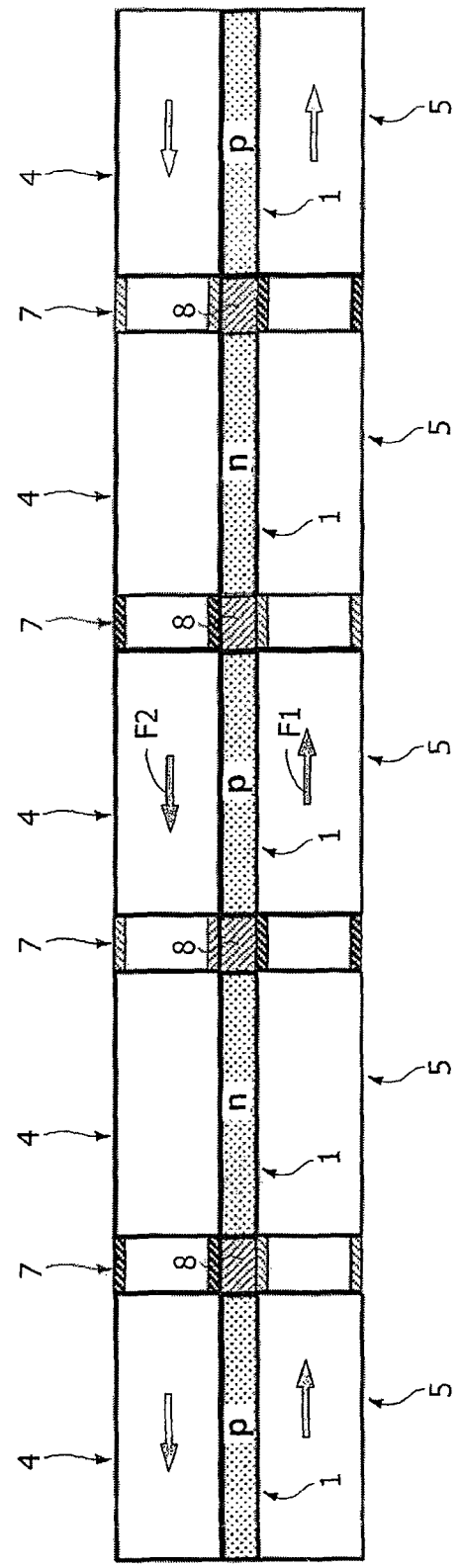

FIG. 10 differs from FIG. 8 in that therein the sections of pipe 4, 5 are set exactly facing and mating with one another. In this case, the electrical continuity through the various thermoelectric sections is ensured by electrical bridges that connect together in twos sections of pipe 4 that are adjacent to one another and sections of pipe 5 that are adjacent to one another. Preferably, said electrical bridges can be integrated in the spacer elements 7. For this purpose, some of the spacer elements 7 (drawn darker in FIG. 10) present the configuration that may be seen in FIG. 5A but are coated with a layer of electrically conductive material.

Figure 11:
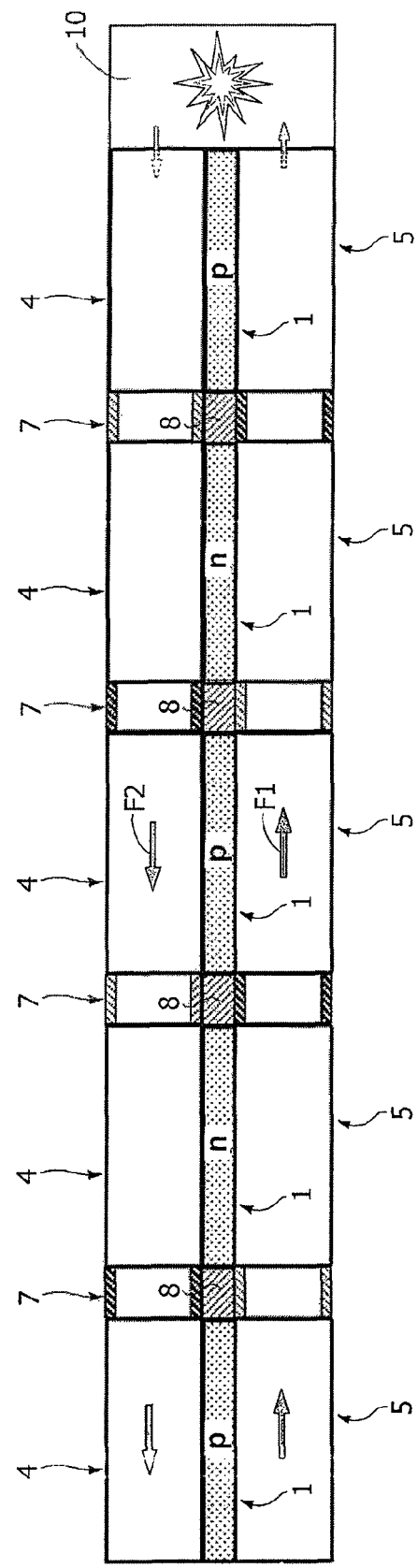

Finally, FIG. 11 differs from FIG. 10 only in that it envisages association of the thermoelectric generator to a combustion chamber 10, according to what has already been described above.

In all of the embodiments discussed above, the number of thermoelectric sections and of the sections of pipe can be any whatsoever. Furthermore, it is possible to envisage configurations different from the elongated rectilinear configuration, such as, for example, a configuration bent over a number of times on itself.

As already mentioned above, preferably the entire structure of the generator is insulated from the outside world with a layer of material with very low thermal conductivity, such as for example silica aerogel.

Furthermore, as also mentioned above, it is possible to envisage different materials for the different thermoelectric sections, according to the respective ranges of operating temperature, in order to obtain an optimal thermoelectric efficiency for each range of temperature.

In the embodiments that envisage it, the combustion chamber 10 described above can be replaced by any device capable of transferring solar energy to the incoming fluid in the form of heat, for example a device of the type usually referred to as "solar furnace".

Of course, without prejudice to the principle of the invention, the details of construction and the embodiments may vary widely with respect to what is described and illustrated herein purely by way of example, without thereby departing from the scope of the present invention.

What is claimed is:
1. A generator of electric energy, comprising:
    a layer of thermoelectric material comprising a series of elements made of thermoelectric material or by a distribution of a number of thermoelectric cells, said layer of thermoelectric material unconnected to a source of electrical current;
    a first pipe receiving and guiding a first flow of fluid at a higher temperature and a second pipe receiving and guiding a second flow of fluid at a lower temperature parallel and adjacent to two opposite sides of the layer of thermoelectric material in such a way as to produce a heat transfer through said thermoelectric layer from a side adjacent to the first flow of fluid towards a side adjacent to the second flow of fluid so as to generate a difference of electrical potential between two electrical terminals that are in electrical connection with the two opposite sides of the layer of thermoelectric material,
    the first pipe comprising a first inlet end and the second pipe comprising a second inlet end, the first flow of fluid at the first inlet end having a higher temperature than the second flow of fluid at the second inlet end,
    walls of said first pipe and said second pipe in heat-conduction contact with the two opposite sides of the layer of thermoelectric material,
    a cavity of passage of each pipe comprising a plurality of subchannels located horizontally and vertically relative to each other, subchannel walls bounding said subchannels having a high thermal conductivity and thermally coupled to inner surfaces of each pipe so as to obtain a large surface of heat exchange between each flow of fluid and each wall of each pipe and between each pipe wall and each side of the layer of thermoelectric material;

wherein the layer of thermoelectric material and the pipes that guide the flows of fluid have a longitudinally segmented structure so that each of said pipes is made up of a succession of sections of pipe separated from one another by hollow spacer elements made of thermally insulating material and, the layer of thermoelectric material is made up of a succession of thermoelectric sections separated from one another by a spacer element made of thermally insulating material or by an air gap; wherein the walls of said first pipe and said second pipe and walls of said hollow spacer elements being electrically conductive or being coated with a layer of electrically conductive material, the walls of the first pipe, the second pipe and the hollow spacer elements electrically connecting said series of elements to each other wherein the heat transfer occurs substantially only between facing sections of the two aforesaid pipes and through the corresponding thermoelectric section and avoids substantially occurring in the longitudinal direction along each pipe;

wherein the pipes are configured to direct the flows of fluid in two directions that are parallel and opposite to one another; and wherein different thermoelectric sections are made of different thermoelectric materials, according to the different range of operating temperature, in such a way that the thermoelectric efficiency of the material of each section is optimized according to the values of temperature to which it is subjected.

2. The generator according to claim 1, wherein each of said pipes is made of a material with high thermal conductivity.

3. The generator according to claim 1, wherein the pipes are designed to direct the flows of fluid in two directions that are orthogonal to one another.

4. The generator according to claim 1, wherein the two pipes are connected at one end thereof to an inlet of a fuel mixture in a combustion chamber and to an outlet of burnt gases from said combustion chamber.

5. The generator according to claim 1, wherein the layer of thermoelectric material, or each thermoelectric section, is made up of thermoelectric cells formed by an array of thermoelectric elements connected electrically in series and thermally in parallel.

6. The generator according to claim 1, wherein the sections of the two pipes are set staggered with respect to one another in such a way as to define a serpentine electrical circuit passing in succession through the various thermoelectric sections.

7. The generator according to claim 1, wherein the structure of the generator is insulated from the outside world by means of a layer of material with very low, thermal conductivity.

8. The generator according to claim 1, wherein said generator presents an elongated rectilinear configuration.

9. The generator according to claim 1, wherein said generator presents a configuration bent over a number of times on itself.

10. The generator according to claim 1, wherein the two pipes are connected at one end thereof to the inlet and to the outlet of a device including means for transferring solar energy in the form of heat to a fluid that traverses it.

11. A method for generating electric energy, comprising:
a first pipe receiving and guiding a first flow of fluid at a first temperature and a second pipe receiving and guiding a second flow of fluid at a second temperature lower that the first temperature, the first pipe and second pipe parallel and adjacent to two opposite sides of a layer of thermoelectric material in such a way as to produce a heat transfer through the thermoelectric layer from a side adjacent to the first flow of fluid towards a side adjacent to the second flow of fluid so as to generate a difference of electrical potential between two electrical terminals that are in electrical connection with the two opposite sides of the layer of thermoelectric material, the first pipe comprising a first inlet end and the second pipe comprising a second inlet end, the first flow of fluid at the first inlet having a higher temperature than the second flow of fluid at the second inlet, walls of the first pipe and the second pipe contacting the two opposite sides of the layer of thermoelectric material so as to provide heat-conduction therebetween, a cavity of passage of each pipe comprising a plurality of subchannels located horizontally and vertically relative to each other, subchannel walls bounding said subchannels having a high thermal conductivity and thermally coupled to inner surfaces of each pipe so as to obtain a large surface of heat exchange between each pipe flow of fluid and each wall of each pipe and between each wall and each side of the layer of thermoelectric material;

the layer of thermoelectric material and the pipes that guide the flows of fluid having a longitudinally segmented structure so that each of said pipes is made up of a succession of sections of pipe separated from one another by hollow spacer elements made of thermally insulating material, the layer of thermoelectric material made up of a succession of thermoelectric sections separated from one another by a spacer element made of thermally insulating material or by an air gap;

the walls of the first pipe and the second pipe, and walls of the hollow spacer elements being electrically conductive or being coated with a layer of electrically conductive material, the walls of the first pipe, second pipe, and the hollow spacer elements electrically connecting the series of elements to each other;

the heat transfer occurring substantially only between facing sections of the two aforesaid pipes and through the corresponding thermoelectric section and avoids substantially occurring in the longitudinal direction along each pipe;

the pipes directing the flows of fluid in two directions that are parallel and opposite to one another; and different thermoelectric sections are made of different thermoelectric materials, according to the different range of operating temperature, in such a way that the thermoelectric efficiency of the material of each section is optimized according to the values of temperature to which it is subjected, each thermoelectric section of the layer of thermoelectric material avoiding connection to a source of electrical current.

12. The method of claim 11 wherein the first pipe comprises a first outlet and the second pipe comprises a second outlet, the first inlet located adjacent to the second outlet located at an opposite end of the second pipe relative to the first inlet.

13. The system of claim 1 wherein said first pipe comprises a first outlet and said second pipe comprises a second outlet, said first inlet located adjacent to said second outlet located at an opposite end of said second pipe relative to said first inlet.

* * * * *